United States Patent
Fan et al.

(10) Patent No.: US 7,049,240 B2
(45) Date of Patent: May 23, 2006

(54) FORMATION METHOD OF SIGE HBT

(75) Inventors: Cheng-Wen Fan, Hsin-Chu Hsien (TW); Hua-Chou Tseng, Hsin-Chu (TW); Chia-Hong Chin, Taipei (TW); Chun-Yi Lin, Taipei (TW); Cheng-Choug Hung, Changhua (TW)

(73) Assignee: United Microelectronics Corp., Hsin-Chu (TW)

( * ) Notice: Subject to any disclaimer, the term of this patent is extended or adjusted under 35 U.S.C. 154(b) by 234 days.

(21) Appl. No.: 10/703,476

(22) Filed: Nov. 10, 2003

(65) Prior Publication Data

US 2005/0101115 A1    May 12, 2005

(51) Int. Cl.
*H01L 21/311* (2006.01)

(52) U.S. Cl. .................. 438/702; 438/189; 438/309
(58) Field of Classification Search ................ 438/691, 438/692, 693, 700, 702, 719, 721, 189, 309, 438/312
See application file for complete search history.

(56) References Cited

U.S. PATENT DOCUMENTS

| | | | | |
|---|---|---|---|---|
| 5,821,149 | A | * | 10/1998 | Schuppen et al. .......... 438/312 |
| 6,589,849 | B1 | * | 7/2003 | Lee ............................. 438/341 |
| 6,680,235 | B1 | * | 1/2004 | U'Ren et al. ................ 438/309 |
| 6,777,302 | B1 | * | 8/2004 | Chen et al. .................. 438/335 |
| 6,861,323 | B1 | * | 3/2005 | Shideler ...................... 438/309 |
| 6,913,981 | B1 | * | 7/2005 | Shideler et al. ............. 438/309 |
| 2004/0150004 | A1 | * | 8/2004 | Aoki et al. .................. 257/197 |
| 2005/0051797 | A1 | * | 3/2005 | Fan et al. .................... 257/197 |
| 2005/0079658 | A1 | * | 4/2005 | Li et al. ....................... 438/189 |

\* cited by examiner

*Primary Examiner*—Kin-Chan Chen
(74) *Attorney, Agent, or Firm*—Arent Fox PLLC

(57) ABSTRACT

A method for forming a SiGe HBT, which combines a SEG and Non-SEG growth, is disclosed. The SiGe base layer is deposited by a Non-SEG method. Then, the first-emitter layer is developed directly upon the SiGe base layer that has a good interface quality between the base-emitter. Next, a second poly silicon layer, which has a dopant concentration range within 1E19 to 1E21 (atom/cc), is deposited by SEG method. It not only reduces the resistance of the SiGe base layer, but also avoids the annealing that may influence the performance of the device.

21 Claims, 5 Drawing Sheets

FORMATION METHOD OF SIGE HBT

BACKGROUND OF THE INVENTION

1. Field of the Invention

The invention relates to a method of manufacturing a silicon-germanium heterojunction bipolar transistor (SiGe HBT), more particularly to a process for manufacturing the SiGe HBT by combining a SEG and Non-SEG method.

2. Description of the Prior Art

Silicon-Based technology in the electrical minimization has some problems due to the fact that the nanometer process is limited by device and manufacturing process limitations. In order to improve the process ability, many electrical device manufactures are looking for methods in solving those problems. One of them is Silicon-Germanium (SiGe) technology, which has a heterojunction between Si/SiGe/Si, its integrated well with the main process which is CMOS. The SiGe technology is a new generation of microelectronics. The application of SiGe devices can be classified into two categories: (1) Heterojunction Field Effect Transistor, HFET; (2) Heterojunction Bipolar Transistor, HBT; however, the focus of attention is on the SiGe HBT technology because it can highly improve the bipolar high frequency characteristic when using SiGe film as a base. Besides, by a development in mobile communication, RF (radio frequency) components are required to be much smaller, lighter, and at the same time multi-functional with a lower power consumption. Furthermore, the SiGe HBT is predominant because it has an advantage using a high frequency, which is easy to integrate with a complementary metal-oxide semiconductor (CMOS) into highly scaled CMOS technologies such as BiCMOS. By a development of hybrid IC technology and monolithic microwave integrated circuit (MMIC) technology, the SiGe HBT may be formed into the IC and the quality of the terminal and system is improved.

Germanium is added to silicon to form the high-performance heterojunction bipolar transistors, in the base of a silicon-germanium alloy, germanium is narrower in bandgap than silicon and faster in electron/hole mobility (about 3~4 times). The silicon-germanium alloy is similar in both their lattices, therefore appropriately growing the quantity of germanium and its structure with the Si/SiGe crystalline layer, therefore improving the performance of the device by employing almost all the existing silicon process'. This kind of technology named Si/SiGe technology that combines both advantages of these two elements, for instance SiGe HBT, SiGe MOSFET etc. The SiGe HBT in which silicon-germanium is used as a base layer and has three different kinds of growth, which are Blanket, Differential and Selective, however, the thickness of the base layer is thinner than the conventional junction transistor. Since germanium can make the energy bandgap become smaller in the base layer, there are some advantages to obtain a high current gain and operating speed with lower power consumption. On the other hand, the lattice of the germanium atom is slightly bigger than the silicon atom and the silicon-germanium film belongs to a Strained Layer so that the quality depends on the conditions of growth, conditions of temperature and the amount of germanium as a dopant.

FIG. 1 is a schematically cross-sectional view of a SiGe HBT by selective epitaxial growth (SEG) method. The SiGe HBT by SEG method comprises a silicon substrate 101, an oxide layer 102, a SiGe intrinsic base 103 by SEG method, a polysilicon extrinsic base 104, a spcer 105, a dielectric layer 106 and a emitter poly 107. The SiGe base layer is grown by the SEG method and then the inner spacer defines the emitter window. Because of a self-aligned process, it can reduce the production of one mask, like that which has just been described, requires the use of at least three masks in this bipolar transistor. In addition, this bipolar transistor does not need an extra implantation and thermal flow during the process to reduce the resistance of the base layer. FIG. 2 is a schematically cross-sectional view of a SiGe HBT by Non-SEG method. The SiGe HBT by Non-SEG method comprises a silicon substrate 201, a SiGe base layer 202 (epi-layer of the SiGe base 203 and polysilicon layer of the SiGe base 204), an oxide layer 205, a buffer polysilicon layer 206, a dielectric layer 207 and an emitter layer 208. The characteristic is that defines the base window and then the thin buffer polysilicon layer is grown upward on the silicon dioxide layer and silicon layer. Afterwards, the SiGe layer is deposited. As a result, the SiGe layer is deposited simultaneously inside the amorphous region and crystalline region (the epi-silicon is grown within the crystalline region, the polysilicon is grown within the amorphous region), the SiGe film is easy to control so as to be a uniform film. Further, its not easy to produce the leakage current between base and emitter.

The bipolar transistor by the selective epitaxial growth method is difficult to control the growing region and the uniformity due to the fact that the inner spacer defines the emitter window. More, it is easy to form a crystal face upward on the emitter window, in which the crystal face is different from the epi-silicon base, therefore, it will produce leakage current between base and emitter. Also, when shrinking the device to have a smaller emitter window, the growth of the SiGe layer will be limited.

On the other hand, the bipolar transistor by a Non-SEG method needs an extra mask to define the emitter window due to lack of the inner spacer, like the one that has just been described, the process requires the use of at least four masks. Hence, the shrinkage of the emitter window will be limited by the ability of process, which is not easy to achieve by dry etching. In addition, the process of this transistor needs an extra implantation and thermal flow to reduce the resistance of the SiGe layer, but the extra implantation and thermal flow will lead transient-enhanced diffusion (TED) effect release and diffuse to a junction that is between the base and the emitter.

Accordingly, both processes have their own advantages and drawbacks respectively, hence, whichever process is chosen, both will have their limitations.

SUMMARY OF THE INVENTION

It is, therefore, a method for manufacturing thereof which combines the SEG and Non-SEG with a silicon-germanium heterojunction bipolar transistor is provided. One of the characteristics is that it deposits the SiGe base layer by Non-SEG method, and directly grows a first emitter layer upon the base layer. Further, a second polysilicon layer is deposited as an extrinsic base upon the first polysilicon layer with low temperature selective epitaxial growth method, and the second polysilicon layer is deposited as a polysilicon film by an in-situ doping method with a dopant concentration within 1E19 to 1E21 (atom/cc). It is, therefore, an objective of the present invention to provide a SiGe HBT with combining SEG and Non-SEG method thereof which is capable of reducing the resistance of the SiGe base layer. It is another objective that is capable to offer a high quality interface between the base and emitter. It is a further objective, which does not need an extra implantation and thermal annealing to influence the performance of the device.

A preferred embodiment of the present invention is provides a process for producing a silicon-germanium heterojunction bipolar transistor by combining SEG and a Non-SEG method. The process comprises the steps as follows: Forming a substrate first, which comprises a p-type epi-layer, a base layer, a dielectric layer and a first polysilicon layer, therein the base layer comprises a SiGe layer by a Non-SEG method. Then, a first emitter layer, a dielectric layer, a bottom anti-reflecting coating (BARC) layer and a first photoresist layer is deposited upon the base layer, respectively. Following that, etching the BARC layer and the first dielectric layer utilizes a first linear pattern as a mask until exposing the first emitter layer and then etching the first emitter layer utilizes the first dielectric layer as a hard mask until exposing the base layer. Next, forming an oxide layer upon the base layer and the first emitter layer by an in-situ steam generated (ISSG) method and then forming a silicon nitride layer upon the oxide layer and the first dielectric layer, further, etching the silicon nitride layer in order to form a spcer. Afterwards, forming a high dopant concentration second polysilicon layer upon the first polysilicon layer as an extrinsic base layer by a low temperature selective epitaxial growth and in situ doping method. The second dielectric layer is deposited upon the second polysilicon layer, further, polishing by chemical mechanical polishing (CMP) and doing etch back after CMP process. Next, the first dielectric layer is removed and then the second emitter layer is grown directly upon the first emitter layer and the second dielectric layer. The second photoresist layer is deposited upon the second emitter layer, also a linear pattern is transferred onto the second photoresist layer and patterning as a second linear pattern. Then, etching the second emitter layer, the second dielectric layer utilizes the second linear pattern as a mask until exposing the second polysilicon layer. Finally, removing the second linear pattern in order to form an emitter window, moreover, the emitter window comprises the first and second emitter layer.

BRIEF DESCRIPTION OF THE DRAWINGS

The objectives and features of the present inventions as well as advantages thereof will become apparent from the following detailed description, considered in conjunction with the accompanying drawings. It is to be understood, however, that the drawings, which are not to scale, are designed for the purpose of illustration and not as a definition of the limits of the invention, for which reference should be made to the appended claims.

DESCRIPTION OF THE PREFERRED EMBODIMENT

Figure 1:
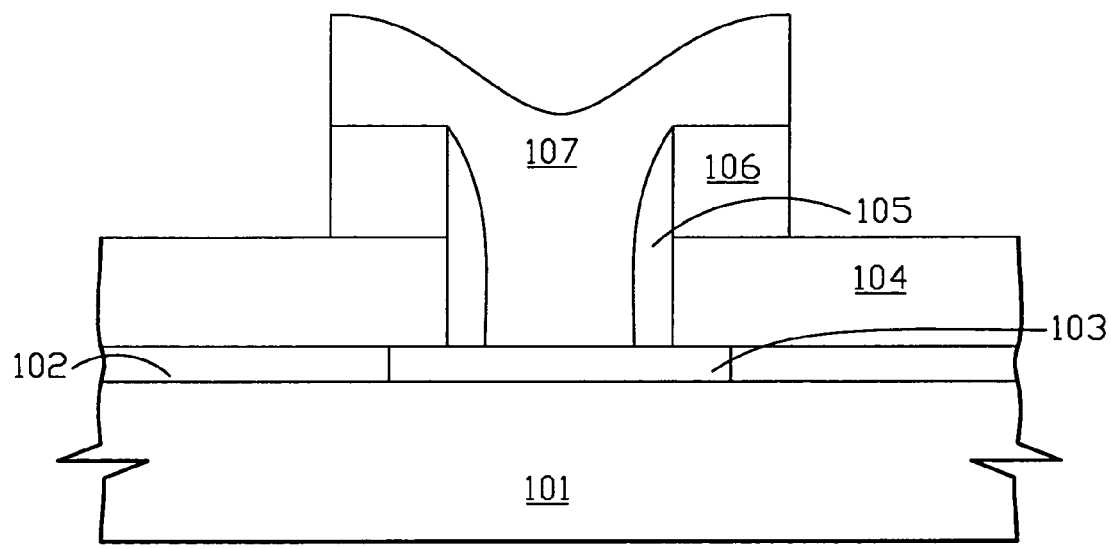
FIG. 1 is a drawing of a prior heterojunction bipolar transistor with silicon-germanium by selective epitaxial growth method.
Figure 2:
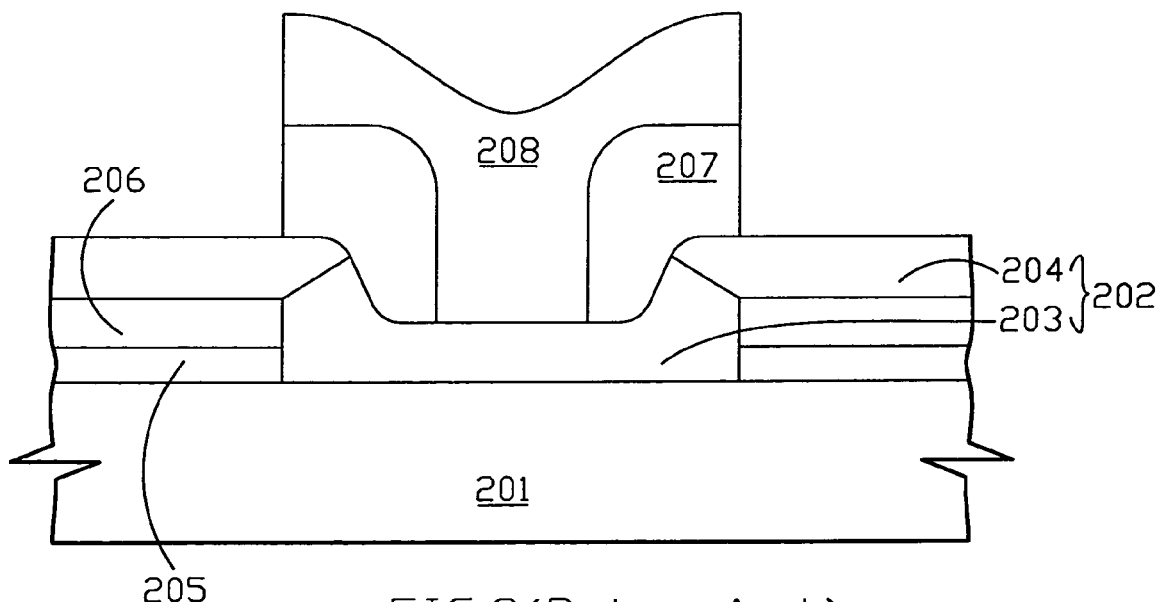
FIG. 2 is a drawing of a prior heterojunction bipolar transistor with silicon-germanium by Non-selective epitaxial growth method.
Figure 3A:
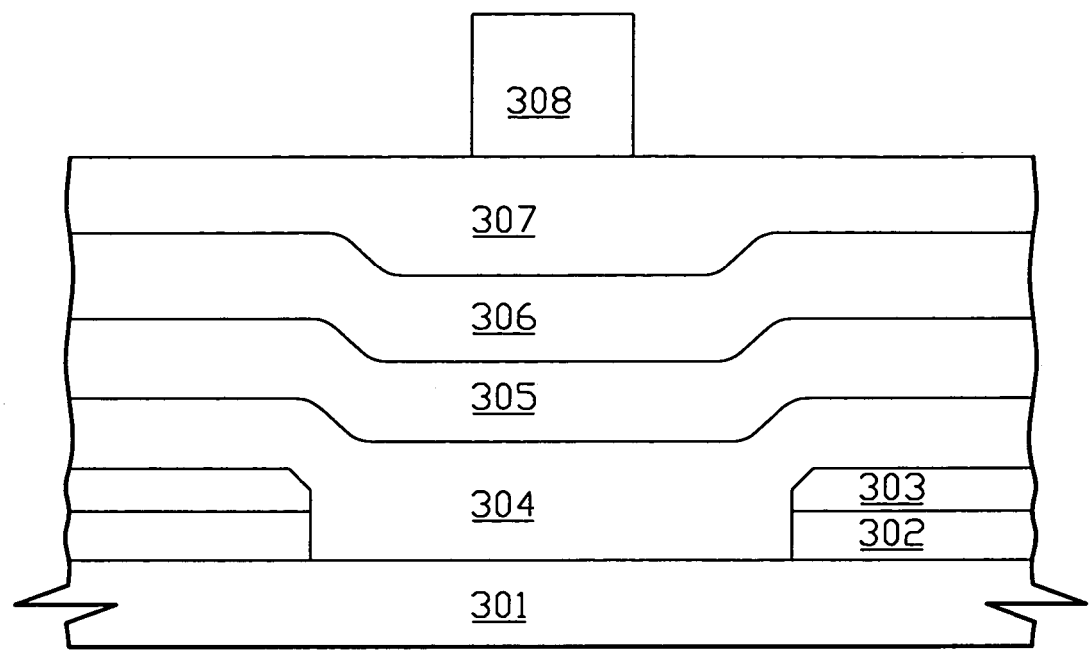
FIGS. 3A to 3H is the schematically cross-sectional views of a semiconductor structure according to preferred embodiment of the present invention.
Figure 3B:
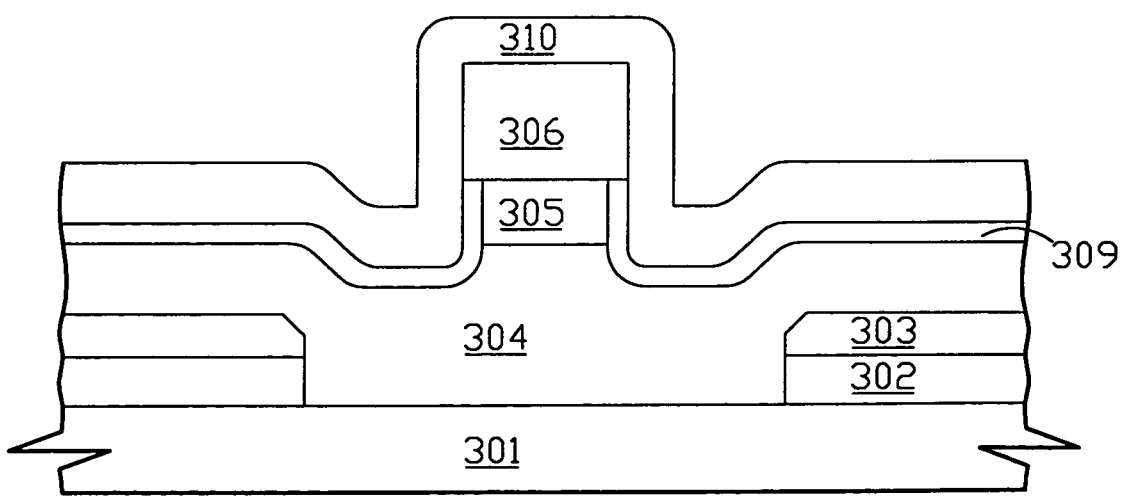
Figure 3C:
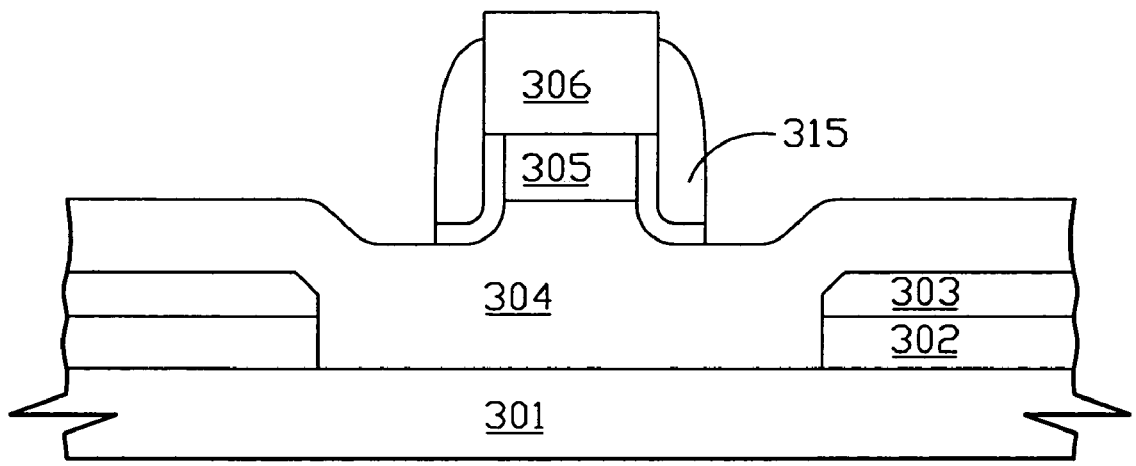
Figure 3D:
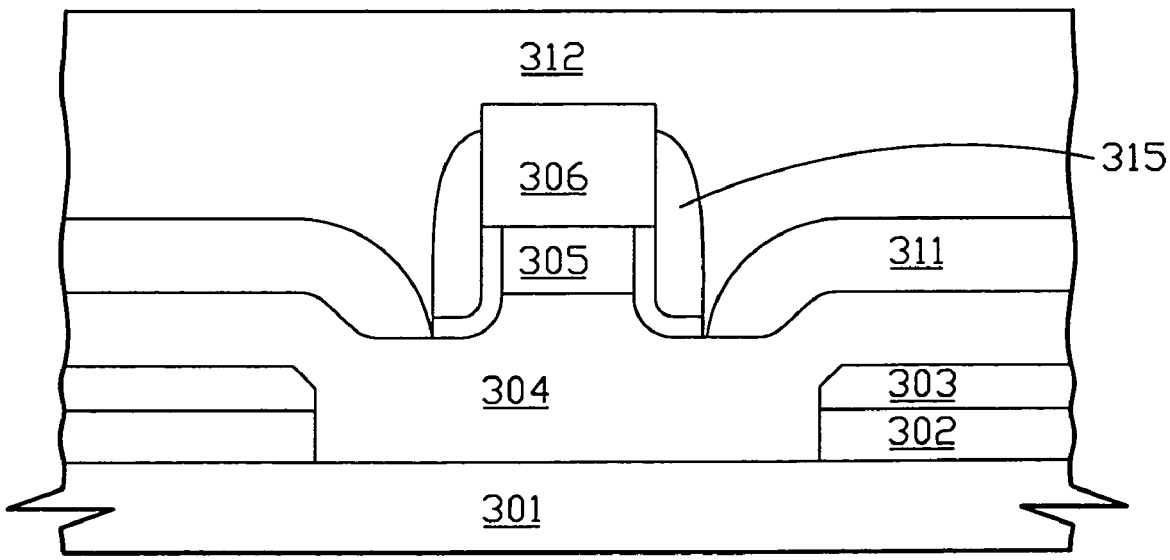
Figure 3E:
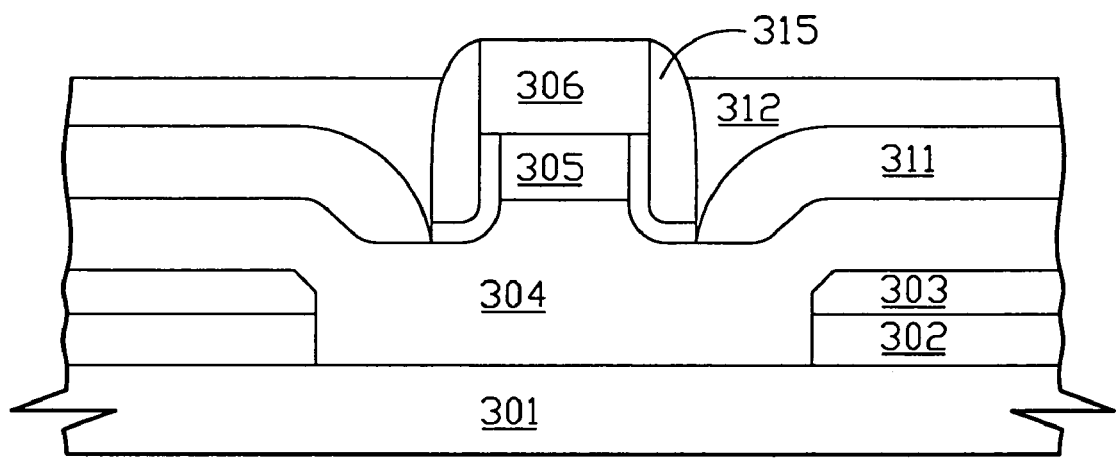

FIGS. 3A to 3H illustrates a process of fabricating a SiGe heterojunction bipolar transistor with combining selective epitaxial growth and a Non-selective epitaxial growth method as an embodiment of the invention. The completed structure of the transistor is seen in FIG. 3E.

Referring to FIG. 3A, a substrate is formed first, for instance a p-type epi-silicon layer 301, on which a dielectric layer 302 is formed, for instance a silicon nitride layer and a first polysilicon layer 303, respectively. Then, etching the dielectric layer 302 and the polysilicon layer 303 until exposing the p-type epi-layer 301 so as to form a base window. After that, a base layer 304 is deposited upon the first polysilicon layer 303 and filled in the base window, wherein the base layer 304 comprises a silicon-germanium layer (Forming the SiGe epi-layer within the crystalline region whereas forming the SiGe polysilicon layer within the amorphous region).

Sequentially, one of the characteristic of the present invention is to grow a first emitter layer 305 upon the base layer 304 directly after cleaning the base layer by hydrofluoric acid. Hence it will have a high quality interface between base and emitter and not produce a leakage current problem. Afterward, a first dielectric layer 306, a BARC layer 307 and a first photoresist layer (it is not shown on the drawing) is deposited upon the first emitter layer 305, respectively, therein the first dielectric layer 306 comprises a tetraethylorthosilicate (TEOS) layer. Then, patterning the first photoresist layer by a linear pattern so as to form a first linear pattern 308, thereby the first linear pattern 308 is formed by a mask, which comprises the reverse-tone or the linear pattern.

Referring to FIG. 3B, etching the BARC layer 307 and the first dielectric layer 306 until exposing the first emitter layer 305 utilizes the first linear pattern 308 as a mask and then removing the first linear pattern 308 and BARC layer 307. Following that, etching the first emitter layer 305 until exposing the base layer 304 utilizes a dielectric layer 306 as a hard mask. After that, the oxide layer 309 is deposited upon the first emitter layer 305 and the base layer 304, among which the oxide layer 309 is formed by in-situ steam generated (ISSG) method. Afterwards, the silicon nitride layer 310 is deposited upon the first dielectric layer 306 and the oxide layer 309.

More, the oxide layer 309 and the dielectric layer 310 is removed partially by anisotropic etch method in order to form a spacer 315, meanwhile; the surface of the first dielectric layer 306 and the part of the SiGe base layer 304 are exposed, as shown in FIG. 3C.

Referring to 3D, after forming the spacer 315, a second polysilicon layer 311 is deposited upon the SiGe base layer 304, therein the second polysilicon layer 311 could be used as an extrinsic base layer. Besides, the second polysilicon layer 311 is formed as a thick and high dopant concentration polysilicon layer by a low temperature selective epitaxial growth method (the dopant concentration within 1E19 to 1E21 (atom/cc)), and is deposited upon the base layer 304 by in-situ doping method. The objective is to prevent the resistance of the base layer 304 from raising due to an over etching by reverse tone. Furthermore, utilization of the in-situ doping can prevent thermal annealing, in order to reduce the resistance after implanting, thus effecting the performance of the device. Then, the second dielectric layer 312 is formed upon the second polysilicon layer 311; therein the second dielectric layer 312 comprises a silicon nitride layer as a cap layer.

Besides, the second dielectric layer 312 is polished and etched back until exposing the first dielectric layer 306 and spacer 315 after depositing, as shown in FIG. 3E.

Figure 3F:
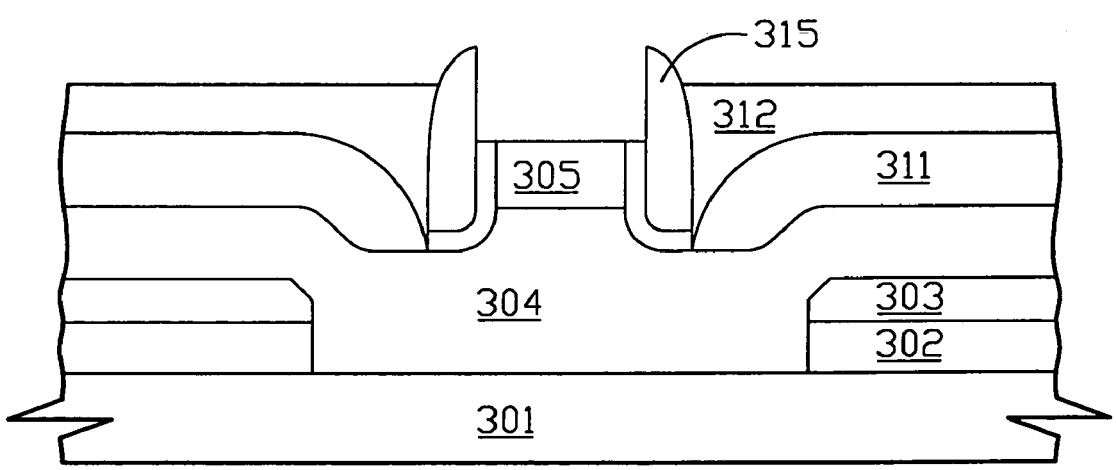
Figure 3G:
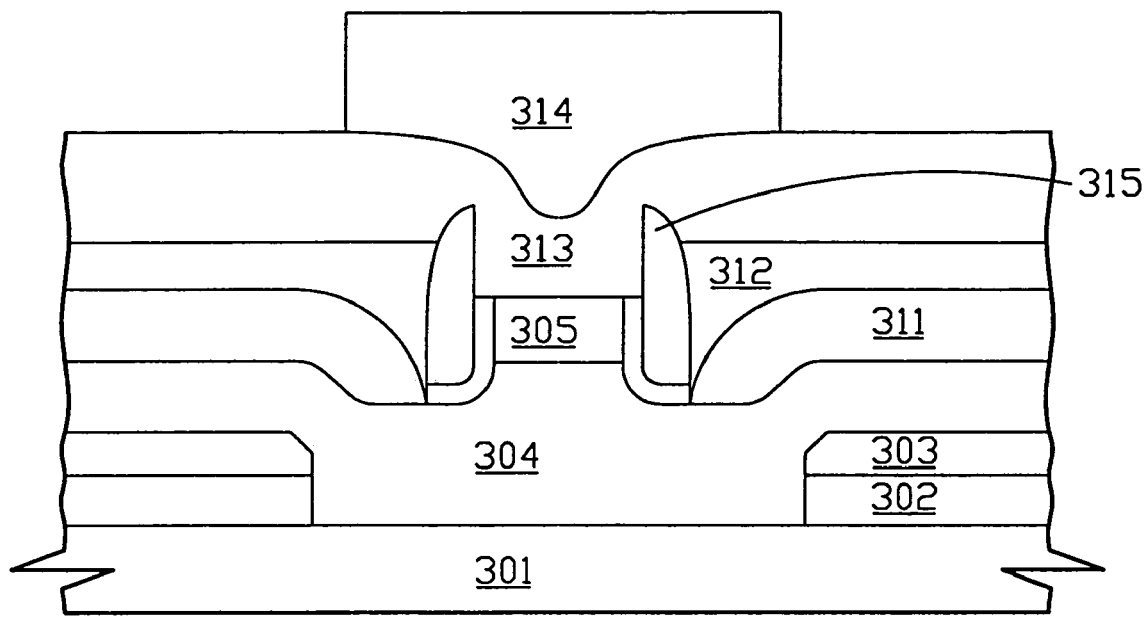

Referring to FIG. 3F, removing the first dielectric layer 306 by a selective wet etching with a buffered oxide etch (BOE) solution so as to expose the first emitter layer 305. After that, as shown in FIG. 3G, the second emitter layer 313 is deposited upon the first emitter layer 305 and the second dielectric layer 312. The other characteristic of this present invention is that the second emitter layer 313 is grown directly upon the first emitter layer 305. Therefore, it will have a high quality interface between the first emitter layer 305 and the second emitter layer 303. Then, the second photoresist layer is deposited upon the second emitter layer 313 and is patterned as a second linear pattern 314.

Figure 3H:
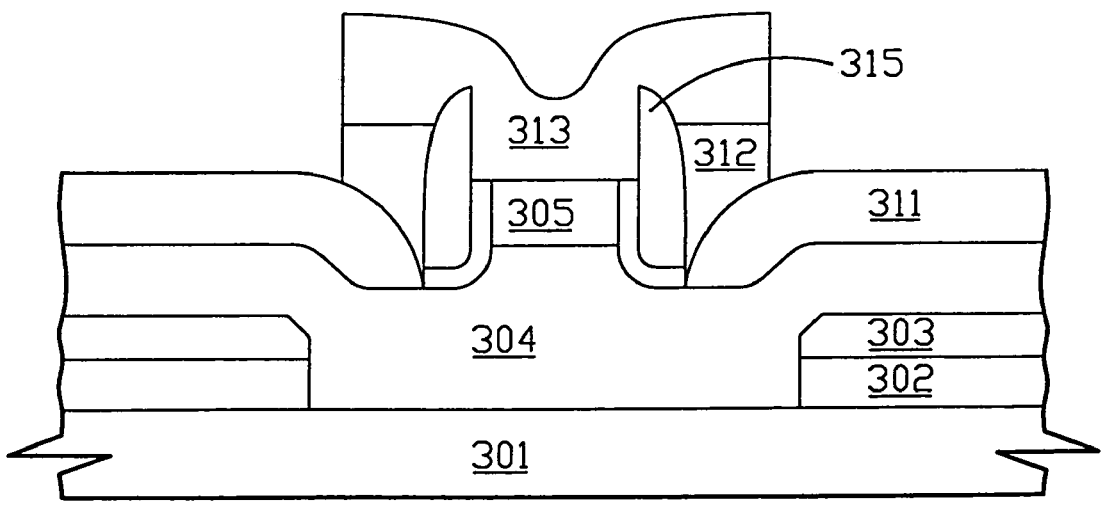

Next, as shown in FIG. 3H, etching the second emitter layer 313 and the second dielectric layer 312 utilizes the second linear pattern 314 as a mask until exposing the second polysilicon layer 311. After that, removing the second linear pattern 314, also, obtains a base window, which combines the first emitter layer 305 and the second emitter layer 313. It also achieves the objective of shrinking the base window. Finally, the SiGe HBT of this present invention is accomplished.

Thus, according to the embodiments of the present invention that realizes the advantages are to provide a second polysilicon film with high dopant concentration (the dopant concentration within 1E19 to 1E21 (atom/cc)) by low temperature SEG and in situ doping method in order to reduce the raised resistance of the base layer because of over etching. Moreover, an extra implantation to influence the performance of the device is not needed. Besides, the emitter layer is grown directly upon the base layer; therefore, it is assured the high quality of the interface between the emitter and base. Furthermore, the emitter layer is comprised of the first emitter layer and the second emitter layer so that it can improve the performance of the heterojunction bipolar transistor except for achieving a high quality interface between the base and emitter.

The embodiments are only used to illustrate the present invention, not intended to limit the scope thereof. Many modifications of the embodiments can be made without departing from the spirit of the present invention.

What is claimed is:

1. A formation method of SiGe HBT, comprising:
   providing a semiconductor structure, which has a p-type epi-silicon surface and first polysilicon surface;
   forming a base layer upon said p-type epi-silicon surface and said first polysilicon surface;
   forming a first emitter layer upon said base layer;
   forming a first dielectric layer upon said first emitter layer;
   forming a spacer structure upon a side wall of said first emitter layer and said first dielectric layer, wherein said base layer is covered partially by said spacer structure;
   covering a second polysilicon layer upon said base layer, wherein said second polysilicon layer is next to said spacer structure and contact with partially;
   forming a second dielectric layer upon said second polysilicon layer;
   planarizing said second dielectric layer until said first dielectric layer and said spacer structure are exposed partially;
   removing said first dielectric layer in order to expose said first emitter layer; and
   forming a second emitter layer upon said first emitter layer.

2. A formation method of SiGe HBT according to claim 1, wherein said base layer comprises a silicon-germanium layer by non-selective epitaxial growth (Non-SEG) method.

3. A formation method of SiGe HBT according to claim 1, wherein said first dielectric layer comprises a tetraethylorthosilicate (TEOS) layer.

4. A formation method of SiGe HBT according to claim 1, wherein said first emitter layer is grown directly upon said base layer.

5. A formation method of SiGe HBT according to claim 1, wherein said second polysilicon layer is formed upon said first polysilicon by low temperature selective epitaxial growth.

6. A formation method of SiGe HBT according to claim 1, wherein said second polysilicon layer is formed by in-situ doping method.

7. A formation method of SiGe HBT according to claim 1, wherein said second dielectric layer comprises a planarizaiton for said second dielectric layer by chemical mechanical polishing (CMP), furthermore, etch back said second dielectric layer after CMP process.

8. A formation method of SiGe HBT according to claim 1, wherein said second dielectric layer comprises a nitride layer.

9. A formation method of SiGe HBT according to claim 1, wherein said second emitter layer is produced by a linear pattern.

10. A formation method of SiGe HBT according to claim 1, wherein said spacer structure comprises an oxide layer upon said side wail emitter window.

11. A formation method of SiGe HBT, comprising:
    providing a semiconductor structure, in which has a p-type epi-silicon surface and first polysilicon surface;
    forming a base layer upon said p-type epi-silicon surface and said first polysilicon surface;
    forming a first emitter layer upon said base layer;
    forming a first dielectric layer upon said first emitter layer;
    forming a bottom anti-reflecting coating layer upon said first dielectric layer;
    forming a first linear pattern upon said bottom anti-reflecting coating layer and above said p-type epi-silicon surface;
    etching said bottom anti-reflecting coating layer and said first dielectric layer until said first emitter layer is exposed, wherein said etching process utilizes said first linear pattern as a mask;
    removing said first linear pattern and said bottom anti-reflecting coating layer
    etching said first emitter layer until said base layer is exposed, wherein said etching process utilizes said first dielectric layer as a hard mask;
    forming a oxide layer upon said side wall of said first emitter layer and said base layer;
    forming a nitride layer upon said oxide layer and said first dielectric layer;
    anisotropic etching said nitride layer and said oxide layer until said base layer is exposed in order to form a spacer structure, wherein said base layer is partially covered by said spacer structure;
    covering a second polysilicon layer upon said base layer, wherein said second polysilicon layer is next to said spacer structure and contact with partially;

covering a second dielectric layer upon said second polysilicon layer;

planarizing said second dielectric layer until said first dielectric layer and said spacer structure are exposed partially;

removing said first dielectric layer in order to expose said first emitter layer;

forming a second emitter layer upon said first emitter layer and said second dielectric layer;

forming a second linear pattern upon said second emitter layer and above said p-type epi-silicon surface;

etching said second emitter layer and said second dielectric layer until said second polysilicon layer is exposed, wherein said etching process utilizes said second linear pattern as a mask; and removing said second linear pattern in order to expose said second polysilicon surface and said second emitter layer.

12. A formation method of SiGe HBT according to claim 11, wherein said base layer comprises a silicon-germanium layer by non-selective epitaxial growth (Non-SEG) method.

13. A formation method of SiGe HBT according to claim 11, wherein said first emitter layer is grown directly upon said base layer.

14. A formation method of SiGe HBT according to claim 11, wherein said first dielectric layer comprises a tetraethylorthosilicate (TEOS) layer.

15. A formation method of SiGe HBT according to claim 11, wherein said second polysilicon layer is formed upon said first polysilicon layer by low temperature selective epitaxial growth.

16. A formation method of SiGe HBT according to claim 11, wherein said oxide layer is formed by in-situ steam generated (ISSG) method.

17. A formation method of SiGe HBT according to claim 11, wherein said oxide layer is formed upon said first emitter layer and said base layer.

18. A formation method of SiGe HBT according to claim 11, wherein comprises means for producing said second polysilicon layer by in-situ doping method.

19. A formation method of SiGe HBT according to claim 11, wherein said range of said concentration of said in-situ doping method is between 1E19 to 1E21 atom/cc.

20. A formation method of SiGe HBT according to claim 11, wherein said second dielectric layer comprises a nitride layer.

21. A formation method of SiGe HBT according to claim 20, wherein comprise said nitride layer is planarized by chemical mechanical polishing method.

* * * * *